United States Patent [19]
Imai

[11] Patent Number: 5,508,537
[45] Date of Patent: Apr. 16, 1996

[54] BIPOLAR TRANSISTOR WITH PARTICULAR BASE STRUCTURE

[75] Inventor: Kiyotaka Imai, Tokyo, Japan

[73] Assignee: NEC Corporation, Tokyo, Japan

[21] Appl. No.: 267,386

[22] Filed: Jun. 29, 1994

[30] Foreign Application Priority Data

Jun. 30, 1993 [JP] Japan .................................. 5-186845

[51] Int. Cl.$^6$ ..................... H01L 31/0328; H01L 31/072; H01L 27/082
[52] U.S. Cl. ........................... 257/197; 257/198; 257/588
[58] Field of Search .................................. 257/592, 587, 257/588, 197, 198, 656

[56] References Cited

U.S. PATENT DOCUMENTS

| | | | |
|---|---|---|---|
| 3,821,779 | 6/1974 | Usuda .................................... | 257/656 |
| 4,975,381 | 12/1990 | Taka et al. .............................. | 257/588 |
| 5,321,301 | 6/1994 | Sato et al. ............................... | 257/588 |
| 5,323,032 | 6/1994 | Sato et al. ............................... | 257/198 |

OTHER PUBLICATIONS

F. Sato, H. Takemura, T. Tashiro, H. Hirayama, M. Hiroi, K. Koyama and M. Nakamae, "A 'Self–Aligned' Selective MBE Technology For High–Performance Bipolar Transistors", *IEDM Technical Digest* (1990) pp. 607–610.

*Primary Examiner*—Wael M. Fahmy
*Attorney, Agent, or Firm*—Popham, Haik, Schnobrich & Kaufman, Ltd.

[57] ABSTRACT

A collector layer of a first electrically conductive type is surrounded by an oxide film for separating elements. A base layer comprising an epitaxial layer of a second electrically conductive type is formed on the collector layer. A polysilicon film of the second electrically conductive type is formed at a first area of a surface of the base layer. An emitter layer of the first electrically conductive type is formed at a second area of a surface of the base layer. A base polysilicon electrode comprising of the second electrically conductive type is formed on the polysilicon film and on the oxide film for separating elements. A sidewall comprising an insulating film is formed over a lateral wall of the base polysilicon electrode and a lateral wall of the polysilicon film. An emitter polysilicon electrode of the first electrically conductive type is formed over the emitter layer and the side wall.

5 Claims, 13 Drawing Sheets

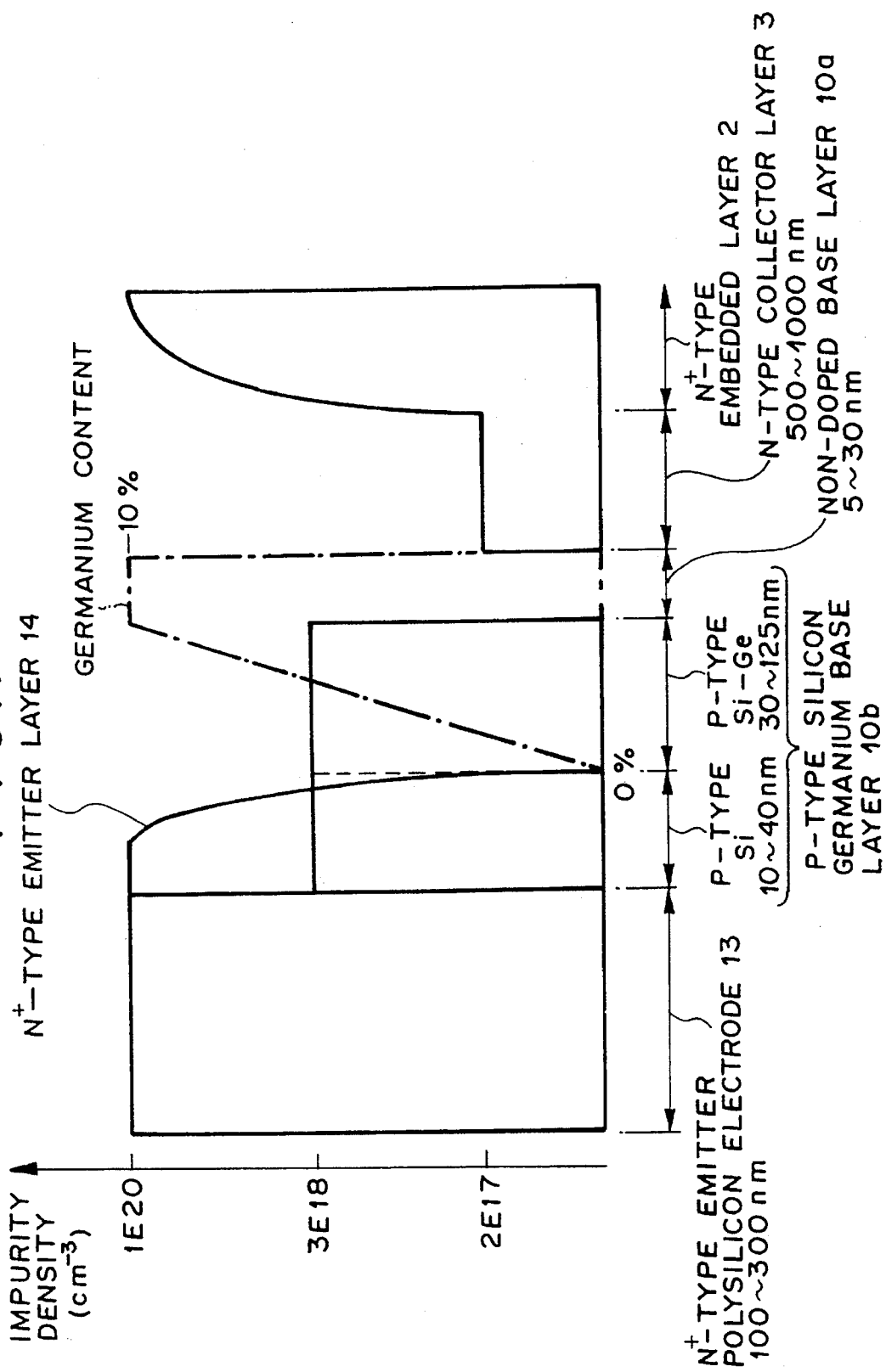

BIPOLAR TRANSISTOR WITH PARTICULAR BASE STRUCTURE

FIELD OF THE INVENTION

The present invention relates to a bipolar transistor and, in particular, to a self-aligned type bipolar transistor having a base comprising an epitaxial layer.

BACKGROUND OF THE INVENTION

It is a major problem to be solved with a bipolar transistor to improve a high frequency characteristic and assure a sufficiently high breakdown voltage. But, in order to improve the high frequency characteristic, it is of vital interest to thin the base. When the base is formed according to an ion implantation process, since an impurity profile presents a Gaussian distribution, it is necessary to thicken the base in order to prevent punch through between a collector and an emitter. Further, the ion implantation process suffers from a number of problems caused by, for example, channeling, dispersions due to the reduction of energy, damages caused by implantation and the like, which poses a limit to achieving ultra thinning of the base.

In recent scholarly circles, a bipolar transistor having a base layer formed by epitaxial process has been published as an alternative to the base structure formed by the conventional ion implantation process. If the epitaxial process is used, since the impurity profile exhibits a stepwise form, even if the base is made thinner than when it is formed according to the ionimplantation process, the punch through breakdown voltage between the collector and the emitter can be assured high. Further, since the thickness of the base and the impurity density can be controlled with excellent accuracy, an extremely thin and properly dense base layer can be formed.

A conventional example of the self-aligned type bipolar transistor having a base formed by the epitaxial process is hereinafter described with reference to one published in Technical Digest of IEDM90, pp. 607–610. In this structure, the base layer is formed with an epitaxial layer selectively grown on a silicon substrate, and constitutes a self-aligned type bipolar transistor utilizing the most state-of-the-art technique. FIGS. 1A through 1E are respectively a cross-sectional view illustrating a manufacturing process of the transistor.

As illustrated in FIG. 1A, after an $n^+$-type embedded layer 2 is formed on a p-type silicon substrate 1, an n-type collector layer 3 is epitaxially grown thereon and an oxide film 4 for separating elements from each other is formed on the n-type collector layer 3. Thereafter, an $n^+$-type collector area 5 is formed, and an oxide film 6, $p^+$-type base polysilicon electrode 7 and a nitride film 8a are formed.

Subsequently, as shown in FIG. 1B, a first sidewall 9a comprising a nitride film is formed on an aperture of the nitride film 8a and $p^+$-type base polysilicon electrode 7.

Next, as shown in FIG. 1C, the oxide film 6 is etched to a predetermined degree according to isotropic wet etching. At this time, a space surrounded by the n-type collector layer 3, $p^+$-type base polysilicon electrode 7 and oxide film 6 is formed.

Subsequently, as shown in FIG. 1D, a p-type base layer 10 is formed on the n-type collector layer 3, which is exposed by etching the oxide film 6, by utilizing the selective epitaxial process. Simultaneously, the p-type base layer 10 and the $p^+$-type base polysilicon electrode 7 are interconnected by a p-type polysilicon film 11 grown from the polysilicon electrode 7.

Next, as shown in FIG. 1E, a second sidewall 12 comprising an oxide film is formed and, subsequently, an $n^+$-type emitter polysilicon electrode 13 is formed and, then, a heat treatment is conducted to form an $n^+$-type emitter layer 14.

In the foregoing transistor structure, the area of the p-type base layer 10 is determined according to the amount of the oxide film 6 to be etched. When the oxide film 6 is retrograded by 0.1 to 0.3 μm from the aperture of the $p^+$-type polysilicon electrode 7, since the interconnecting area between the p-type base layer 10 and the $p^+$-type base polysilicon electrode 7 can be set to 0.1 to 0.3 μm, the area of the p-type base layer 10 can be made extremely small.

In this conventional example, the oxide film 6 sandwiched between the $p^+$-type base polysilicon electrode 7 and the n-type collector layer 3 remains. This is because a margin is necessary between the distance by which the oxide film 6 is to be retrograded by wet etching and the distance ranging from the oxide film 4 for separating the elements up to the aperture end of the $p^+$-type base polysilicon electrode 7. That is, it is necessary to form the aperture of the $p^+$-type base polysilicon electrode 7 in alignment with the oxide film 4 for separating the elements, and if the distance between the oxide film 4 and the aperture of the $p^+$-type base polysilicon electrode 7 is the same as that by which the oxide film 6 is to be retrograded and there is any misalignment therebetween, then even the oxide film 4 will be etched, at which time, as shown in FIG. 2, in the space 15 produced by etching the oxide film 4, since the p-type base layer 10 and the $p^+$-type base polysilicon electrode 7 cannot be interconnected, a need to allow for a margin for compensating the misalignment therein arises.

FIG. 3 illustrates a plan view of a base area according to the conventional example. Assuming that the aperture size be 0.5×2.0 μm², the distance by which the oxide film 6 be to be retrograded 0.2 mm, and the margin between the oxide film 4 and the aperture of the $p^+$-type base polysilicon electrode 7 be 0.3 μm, 0.3 μm in width of the oxide film 6 corresponding to this margin is left between the p-type base layer 10 and the oxide film 4. Assuring that the thickness of the oxide film 6 be 100 nm, a capacitance of about 0.8 fF is applied as the parasitic capacitance between the $p^+$-type base polysilicon electrode 7 and the n-type collector layer 3. Since the junction capacitance between the p-type base layer 10 and the n-type collector layer 3 is on the order of 2.5 through 4 fF, the above parasitic capacitance will rise the total base capacitance by as much as 20 through 32%.

Further, this conventional example has suffered from a problem that the base resistance becomes great because the area of the interconnecting portion between the p-type base layer 10 and the $p^+$-type base polysilicon electrode 7 is no more than theamount by which the oxide film 6 is to be retrograded by etching. If the distance by which the oxide film 6 is retrograded by etching is set to more than 0.2 μm in order to reduce the base resistance, then, as shown in FIG. 4, voids 16 are likely to occur. This is due to the fact that the growth reaction slows down because the lateral surface comprises an oxide film at the innermost portion of a cavity portion formed by etching the oxide film 6. That is, the foregoing solution cannot reduce the base resistance.

SUMMARY OF THE INVENTION

The present invention was made in order to solve the foregoing problems, and its object is to reduce the parasitic capacitance between the base and the collector in the bipolar transistor.

A further object of the present invention is to provide a bipolar transistor in which the base resistance is reduced.

A still further object of the present invention is to provide a bipolar transistor which may facilitate to achieve high reliability.

According to the present invention, there is provided a bipolar transistor comprising:
- a collector layer of a first electrically conductive type surrounded by an oxide film for separating elements;
- a base layer comprising an epitaxial layer of a second electrically conductive type formed on the collector layer;
- a polysilicon film of the second electrically conductive type formed at a first area of a surface of the base layer;
- an emitter layer of the first electrically conductive type formed at a second area of a surface of the base layer;
- a base polysilicon electrode comprising of the second electrically conductive type formed on the polysilicon film and on the oxide film for separating elements;
- a sidewall comprising an insulating film formed over a lateral wall of the base polysilicon electrode and a lateral wall of the polysilicon film; and
- an emitter polysilicon electrode of the first electrically conductive type formed over the emitter layer and the side wall.

In the present invention, an additional base layer comprising a non-doped epitaxial layer may be interposed between the collector layer and the base layer. Herein, an energy band gap of the additional base layer may be made narrower than that of the collector layer, an energy band gap of the base layer aligning with that of the additional base layer at a portion where it contacts the additional base layer and being gradually widened as it becomes spaced apart from the additional base layer.

In the present invention, an additional collector layer comprising an epitaxial layer of the first electrically conductive type may be interposed between the collector layer and the base layer.

In the present invention, the base layer may be separated from the base polysilicon electrode by the polysilicon film.

In the present invention, the first area may include an outer peripheral portion of an upper surface of the base layer.

In the present invention, the first area may include an outer peripheral portion of an upper surface and a lateral surface of the base layer.

In the present invention, a surface of the base polysilicon electrode may be coated with a boron silicate glass film, and at least part of the sidewall may be made of boron silicate glass.

The bipolar transistor of the present invention can be manufactured by a method comprising steps of:
- selectively forming a silicon nitride film on a collector layer of a first electrically conductive type;
- thermally oxidizing the surface of the collector layer with the silicon nitride film used as a mask to form an oxide film for separating elements;
- forming a base polysilicon electrode of a second electrically conductive type having an emitter aperture at a central portion thereof ranging from the oxide film for separating elements up to an active area surrounded by the oxide film for separating elements;
- forming a sidewall comprising an insulating film on the lateral wall of the emitter aperture;
- etching the silicon nitride film for removal; and
- epitaxially growing a base layer of the second electrically conductive type on the collector layer at the active area while growing a polysilicon film of the second electrically conductive type on the lower surface of the base polysilicon electrode.

The bipolar transistor of the present invention can also be manufactured by a method comprising steps of:
- forming a thermal oxide film and a silicon nitride film on a collector layer of a first electrically conductive type to pattern the two films so as to remain on an active area;
- thermally oxidizing the surface of the collector layer with the silicon nitride film used as a mask to form an oxide film for separating elements;
- forming a base polysilicon electrode of a second electrically conductive type having an emitter aperture at a central portion thereof ran in from the oxide film up to the silicon nitride film:
- forming a sidewall comprising an insulating film on the lateral wall of said emitter aperture;
- etching the thermal oxide film at the active area for removal;
- forming a non-doped epitaxial layer forming an additional base layer at a portion where the thermal oxide film was removed:
- etching the silicon nitride film for removal; and
- epitaxially growing a base layer of the second electrically conductive type on the additional base layer at the active area while growing a polysilicon film of the second electrically conductive type on the lower surface of the base polysilicon electrode.

The bipolar transistor of the present invention can also be manufactured by a method comprising steps of:
- forming a thermal oxide film, a polysilicon film and a silicon nitride film on a collector layer of a first electrically conductive type to pattern these three films so as to remain on an active area;
- thermally oxidizing the surface of the collector layer with said silicon nitride film used as a mask to form an oxide film for separating elements;
- forming a base polysilicon electrode of a second electrically conductive type having an emitter aperture at a central portion thereof ranging from the oxide film up to the silicon nitride film;
- forming a sidewall comprising an insulating film on the lateral wall of the emitter aperture;
- etching the polysilicon film and the thermal oxide film at the active area for removal;
- forming an epitaxial layer of the first electrically conductive type forming an additional collector layer at the portion where the polysilicon film and the thermal oxide film were removed;
- etching the silicon nitride film for removal; and
- epitaxially growing a base layer of the second electrically conductive type on the additional collector layer at the active area while growing a polysilicon film of the second electrically conductive type on the lower surface of the base polysilicon electrode.

The bipolar transistor according to the present invention can be realized by providing a base polysilicon electrode having an emitter aperture on a nitride film used as a mask when the oxide film for separating elements is formed and by epitaxially growing a base layer at a portion where the nitride film is removed, to achieve the following effects.

(1) Since the p$^+$-type base polysilicon electrode and the n-type collector layer are not opposed, the parasitic capacitance therebetween can be greatly reduced. That is, as compared with the conventional structure in which the p$^+$-type base polysilicon electrode 7 and the n-type collector layer are opposed via the oxide film 6, the structure according to the present invention can reduce the parasitic capacitance of this portion by 70 through 90%.

(2) Since the p-type base layer is interconnected to the lateral surface as well as the lower surface of the p$^+$-type base polysilicon electrode via the p-type polysilicon film, its contact area is made larger and the base resistance is reduced. As a result, the transistor with the emitter size of 0.5×2 μm$^2$ allows the base resistance to be reduced by 10 through 30% as compared with the conventional structure while the dispersions of the base resistance can be reduced from about ±20% (for the conventional structure) to about ±10%.

(3) When the p-type base layer is grown, since the p-type polysilicon film is made by growing not only from the lower surface but also from the lateral surface of the p$^+$-type base polysilicon electrode, voids as occur in the conventional structures as shown in FIG. 4 cannot occur. Consequently, a highly reliable product can readily be provided.

BRIEF DESCRIPTION OF THE DRAWINGS

FIG. 7 is a diagram of an impurity profile in a bipolar transistor according to the second embodiment of the present invention;

DETAILED DESCRIPTION OF THE PREFERRED EMBODIMENTS

Figure 1A:
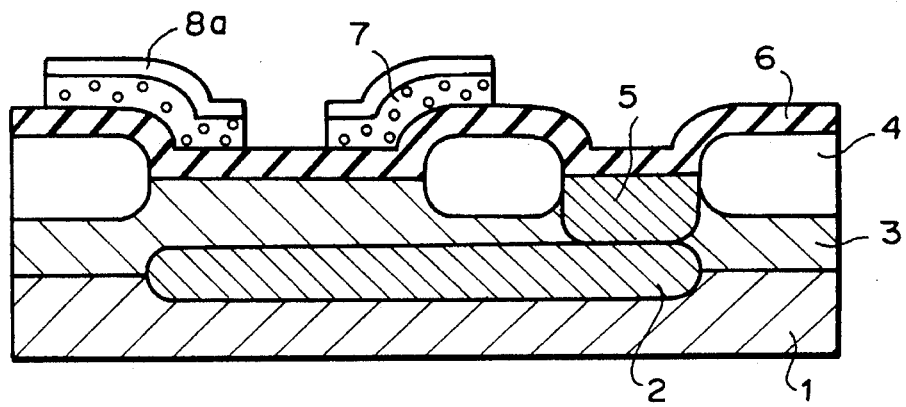
FIGS. 1 trough 1E are respectively a cross-sectional view illustrating a process for manufacturing a conventional bipolar transistor.
Figure 1B:
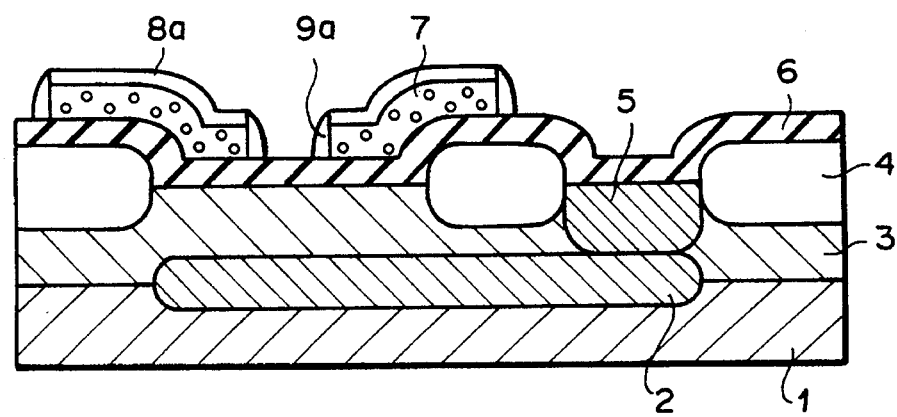
Figure 1C:
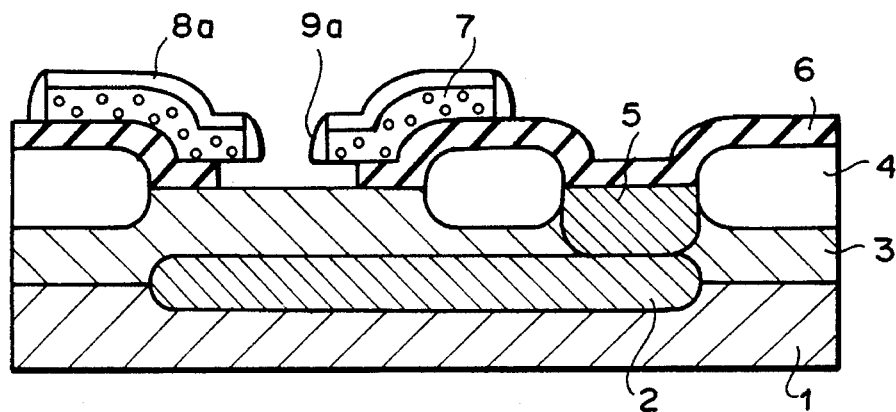
Figure 1D:
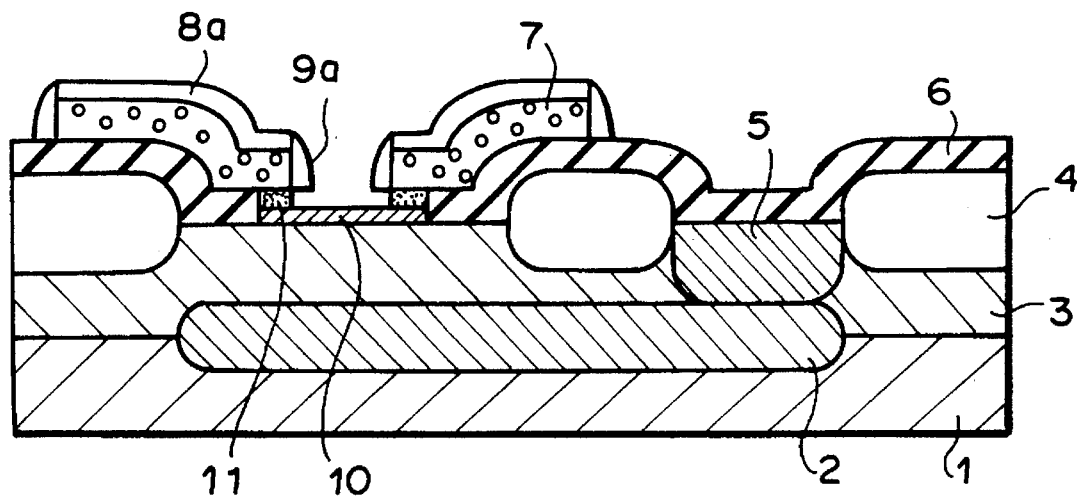
Figure 1E:
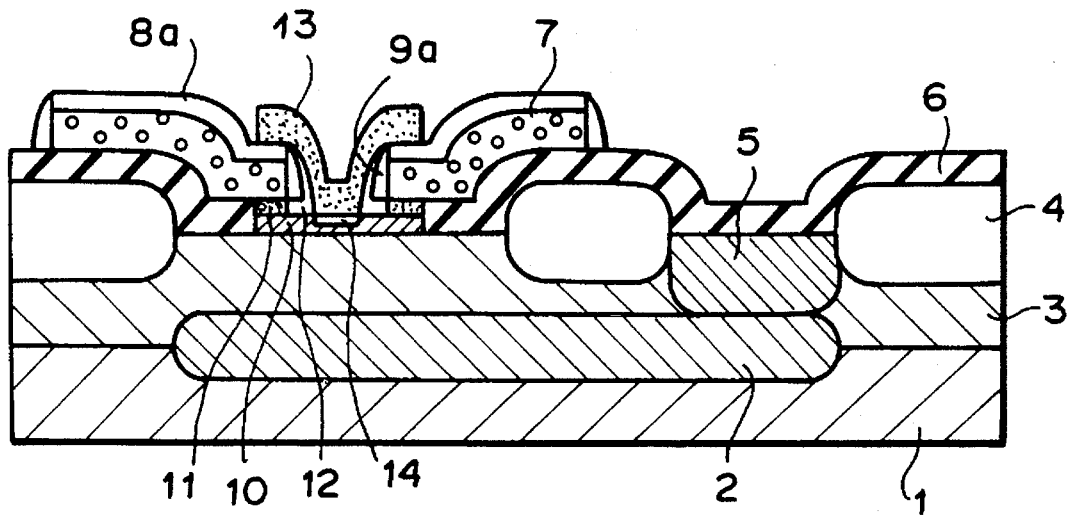
Figure 2:
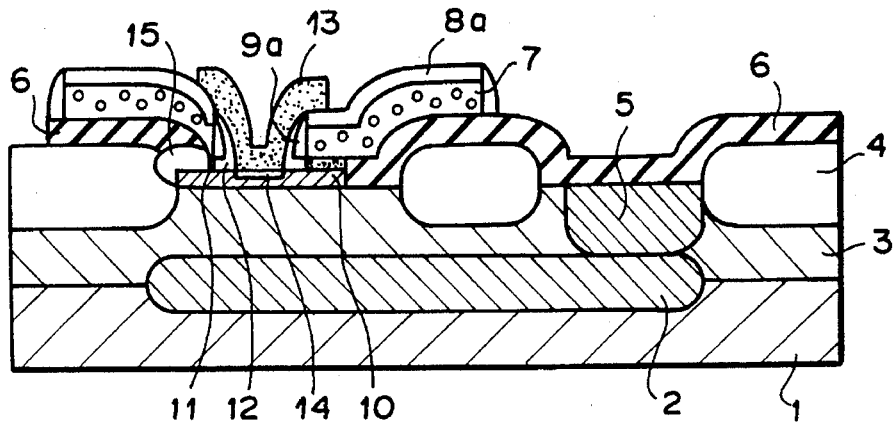
FIG. 2 is a cross-sectional view for revealing conventional problems.
Figure 3:
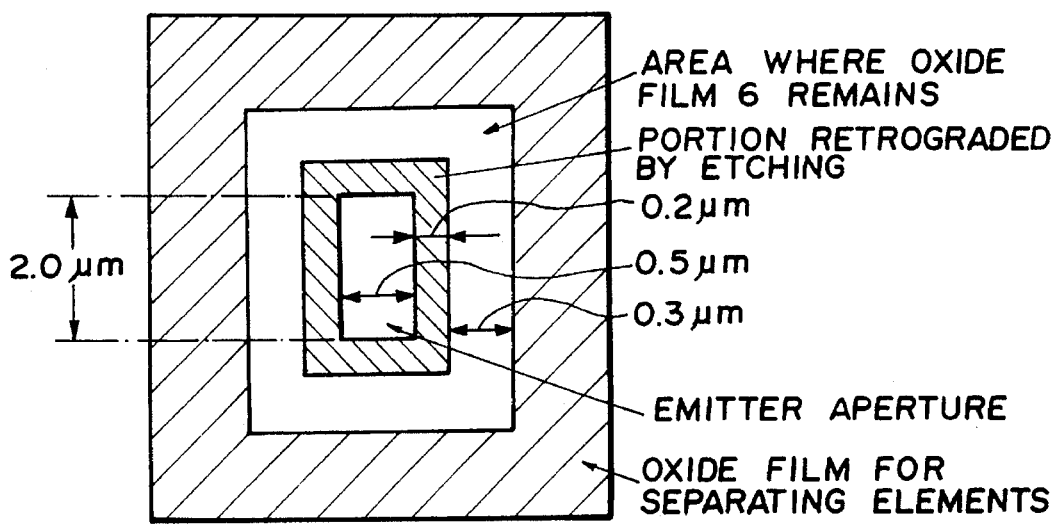
FIG. 3 is a plan view for revealing the conventional problems.
Figure 4:
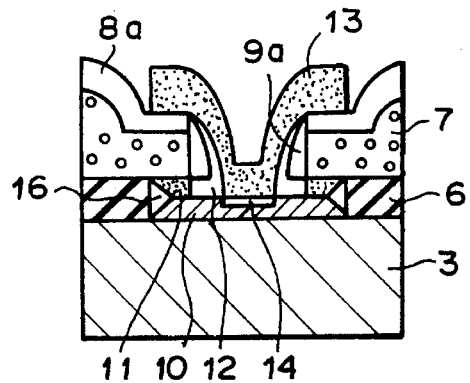
FIG. 4 is a cross-sectional view for revealing the conventional problems.

Next, some preferred embodiments of the present invention are described with reference to the accompanying drawings.

FIGS. 5A through 5H are respectively a cross-sectional view illustrating a first embodiment of the present invention, the views illustrating at each manufacturing process according to the orders that follow.

At first, an n$^+$-type embedded layer 2 is formed on a p-type silicon substrate 1, and thereon, an n-type collector layer 3 comprising a silicon epitaxial layer is formed. Next, a thermal oxide film 101 preferably with 5 through 30 nm of the film thickness is formed into the film thickness of 10 nm (the preferred numerical range will be hereinafter shown in parentheses following the numerical value examples of the embodiment) and, thereon, a nitride film 102 is grown into the film thickness of 80 nm (50 nm through 200 nm). Next, with a resist (not shown) used as a mask, the thermal oxide film 101 and the nitride film 102 are partially removed by dry etching and, further, after the exposed surface of the n-type collector layer 3 is depressed by 150 nm (100 nm through 300 nm) by dry etching, the resist is removed (see FIG. 5A).

Figure 5A:
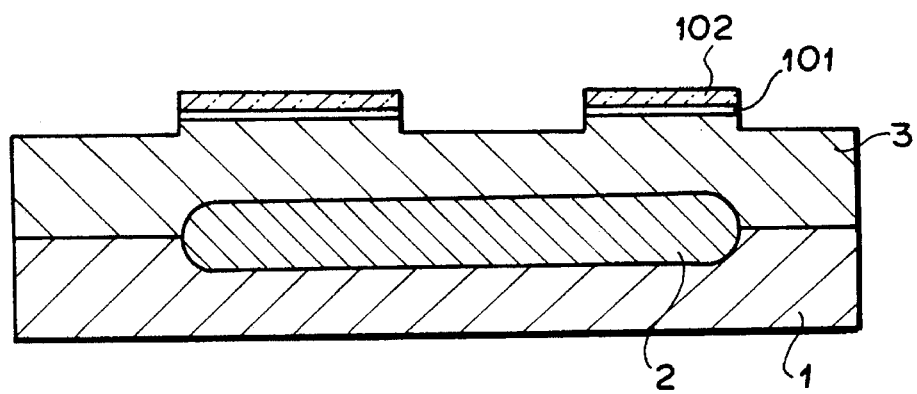
FIGS. 5A through 5H are respectively a cross-sectional view illustrating a process for manufacturing a bipolar transistor according to a first embodiment of the present invention.
Figure 5B:
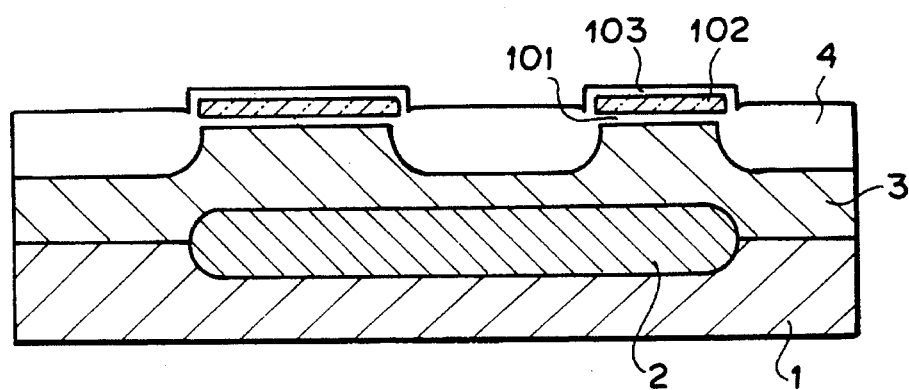

Next, as shown in FIG. 5B, an oxide film 4 having the film thickness of 300 nm (200 nm through 600 nm) for separating elements is formed by steam heat oxidization and, thereafter, an oxide film 103 having the film thickness of 10 nm (5 nm through 20 nm) is grown.

Figure 5C:
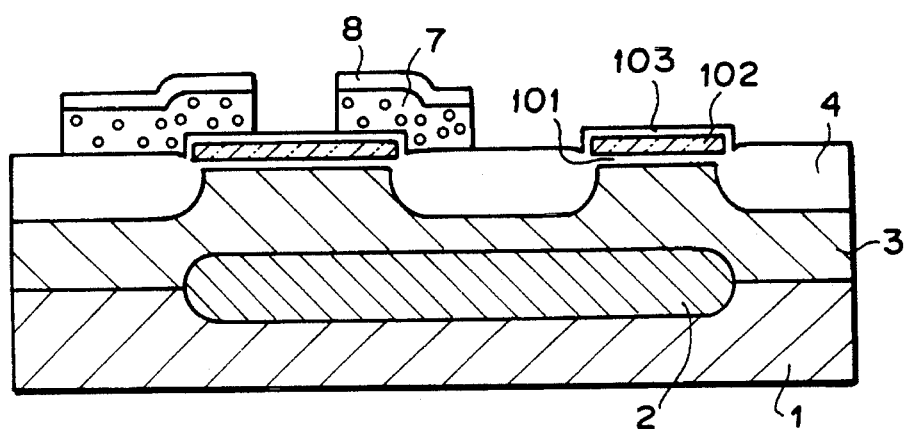

Next, as shown in FIG. 5C, a p$^+$-type polysilicon film having the thickness of 200 nm (100 nm through 300 nm) and a boron silicate glass film 8 having the thickness of 100 nm (100 nm through 300 nm) (boron density: 3 through 10 mol %) are grown. Then, both of them are patterned by dry etching with a resist used as a mask, to form a p$^+$-type base polysilicon electrode 7 before the resist is removed. At this time, an aperture (emitter aperture) is formed at the center of the boron silicate glass film 8 as well as p$^+$-type base polysilicon electrode 7.

Figure 5D:
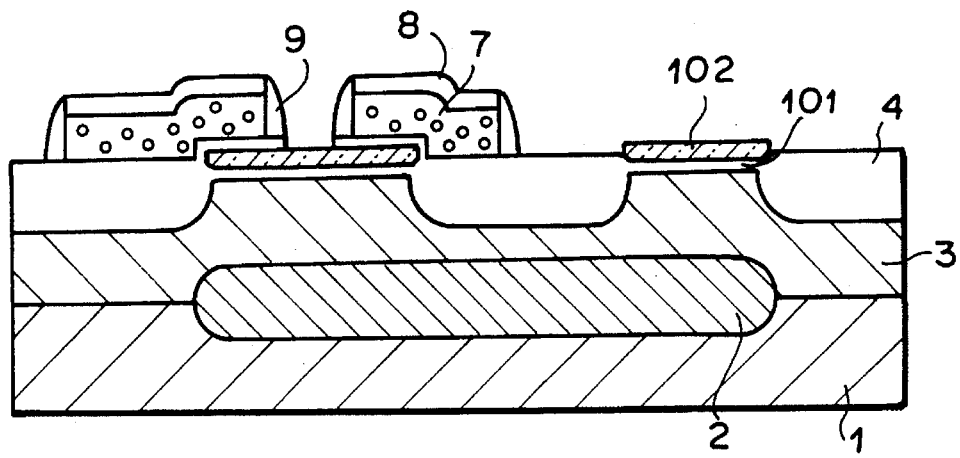

Next, as shown in FIG. 5D, a boron silicate glass film having the thickness of 100 nm (100 nm through 200 nm) (boron density: 3 through 10 mol %) is grown to form a first sidewall 9 along the aperture lateral surface and outer peripheral surface of the boron silicate glass film 8 and p$^+$-type base polysilicon electrode 7 by anisotropic dry etching. At this time, the oxide film 103 of the aperture portion is simultaneously etched.

Figure 5E:
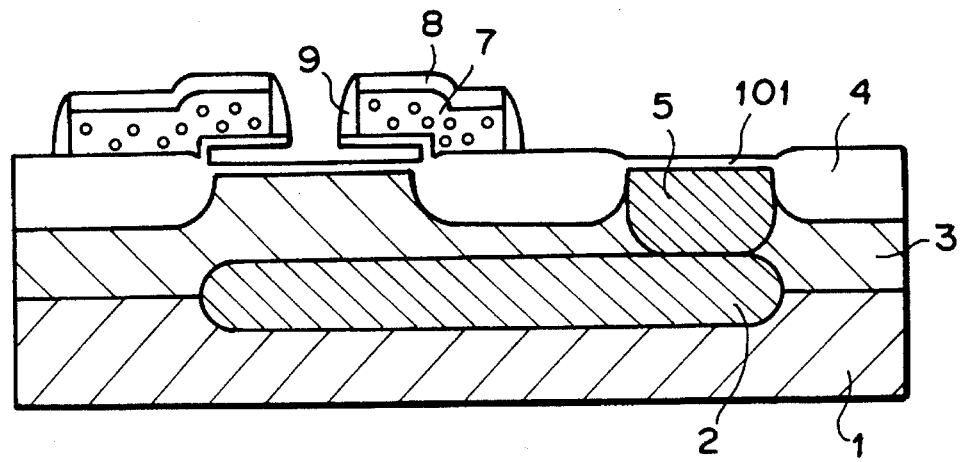

Next, as shown in FIG. 5E, the nitride film 102 is removed by isotropic wet etching. Then, ions are implanted with a resist (not shown) used as a mask to form an n$^+$-type collector area 5. Then, the resist is removed.

Figure 5F:
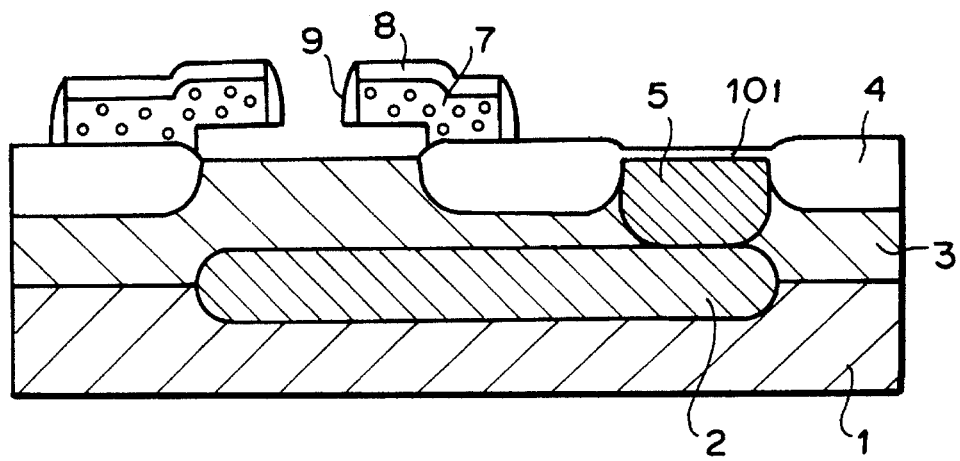

Next, as shown in FIG. 5F, after the thermal oxide film 101 lying on the surface of the n$^+$-type collector lead area 5 is covered with resist (not shown), isotropic wet etching is conducted to remove the thermal oxide film 101 and oxide film 103 within the aperture. At this time, since the first sidewall 9 comprising the boron silicate glass film and the boron silicate glass film 8 are slow in etching rate as compared with the thermal oxide film 101 and the oxide film 103, even if the thermal oxide film 101 and the oxide film 103 each having the thickness of 10 nm are overetched by 50 through 100%, the boron silicate glass film 8 and the first sidewall 9 are only etched by about 5 nm through 10 nm, so that a sufficient film thickness can be still assured to insulate the p$^+$-type base polysilicon electrode 7 and the n$^+$-type emitter polysilicon electrode (13; described later). After that, the resist is removed. As a result, a cavity is formed surrounded by the n-type collector layer 3, oxide film 4 for separating elements and the p$^+$-type base polysilicon electrode 7. The depth of this cavity equals 250 nm (100 nm through 400 nm) as measured from the aperture, and its height 100 nm (60 nm through 250 nm).

Figure 5G:
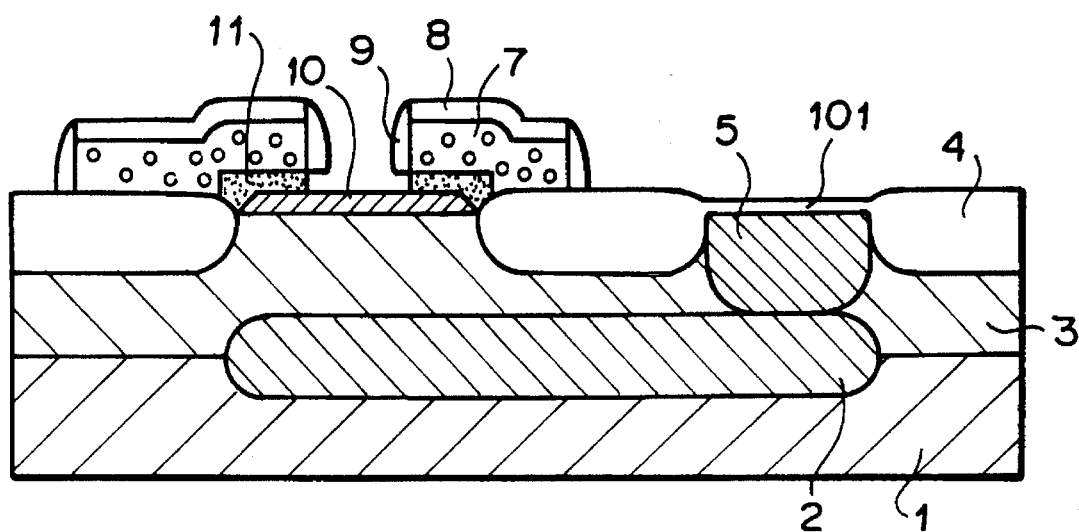

Next, as shown in FIG. 5G, utilizing the selective epitaxial growth process, a p-type base layer 10 comprising a p-type silicon epitaxial layer having the impurity density of 1E18 through 3E19 cm$^{-3}$ and the thickness of 50 nm (30 nm through 125 nm) is selectively formed on the exposed surface portion of the n-type collector layer 3. At this-time, the p-type base layer 10 and the p$^+$-type base polysilicon electrode 7 are simultaneously interconnected by the p-type polysilicon film 11 growing from the p$^+$-type base polysilicon electrode 7. In this silicon growth process, since the lateral surface of the innermost portion of the cavity is made of polysilicon, silicon can be steadily grown as compared witty that for the conventional process.

Figure 5H:
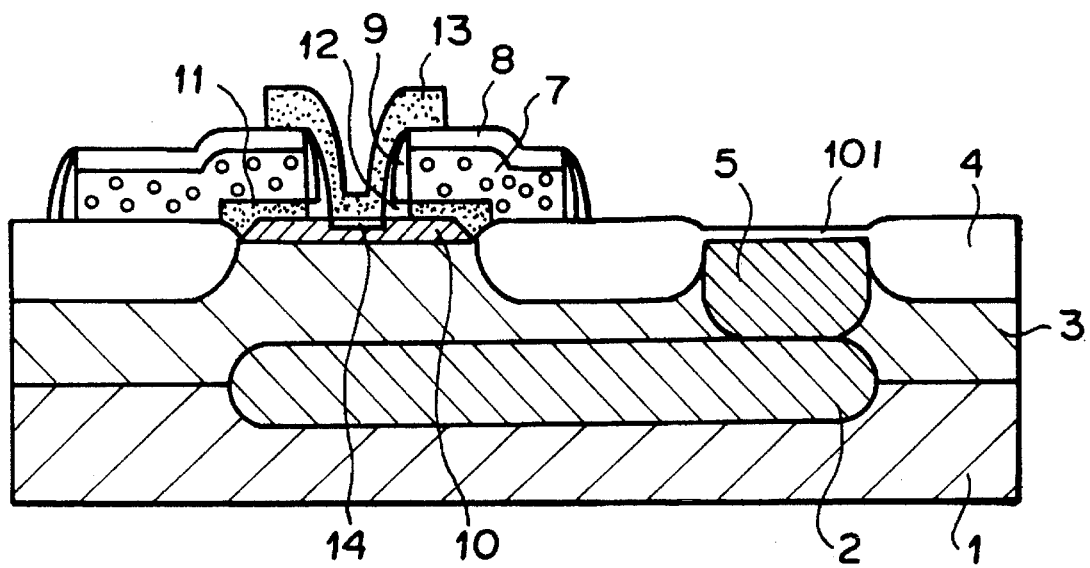

Next, as shown in FIG. 5H, an oxide film having a thickness of 80 nm (50 nm through 200 nm) is grown and then a second sidewall 12 is formed by anisotropic etching. Then, an n$^+$-type emitter polysilicon electrode 13 is formed and, subsequently, a heat treatment is conducted to form an n$^+$-type emitter layer 14.

FIGS. 6A through 6E are respectively a cross-sectional view illustrating a second embodiment of the present invention.

In order to manufacture a transistor according to the second embodiment, first, each process as illustrated in FIGS. 5A through 5C of the first embodiment is carried out.

Figure 6A:
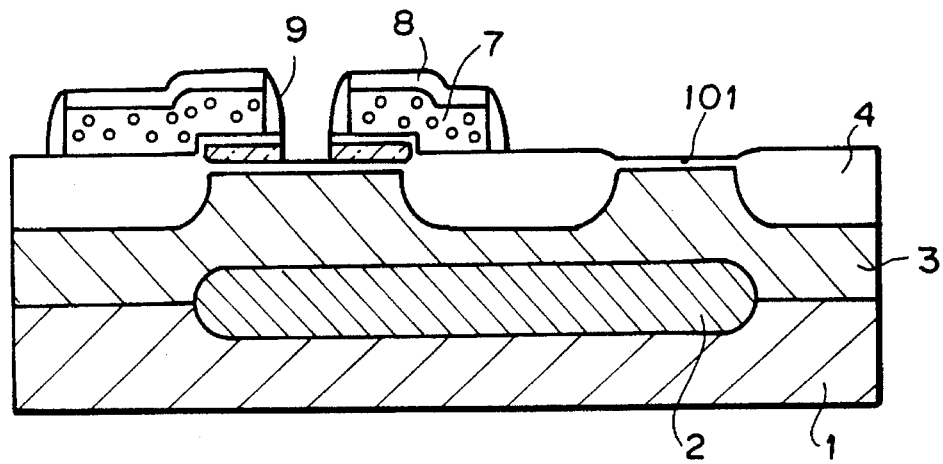
FIGS. 6A through 6E are respectively a cross-sectional view illustrating a process for manufacturing a bipolar transistor according to a second embodiment of the present invention.

Next, as shown in FIG. 6A, after a boron silicate glass film (boron density: 3 through 10 mol %) having a thickness of 100 nm (100 nm through 200 nm) is grown, the anisotropic dry etching is conducted to form a first sidewall 9 along the aperture lateral surface and outer peripheral surface of the boron silicate glass film 8 and p$^+$-type base polysilicon electrode 7. At this time, the oxide film 103 and the nitride film 102 of the aperture portion are simultaneously etched. Also, the oxide film 103 and the nitride film 102 at the portion for forming a collector lead area are removed.

Figure 6B:
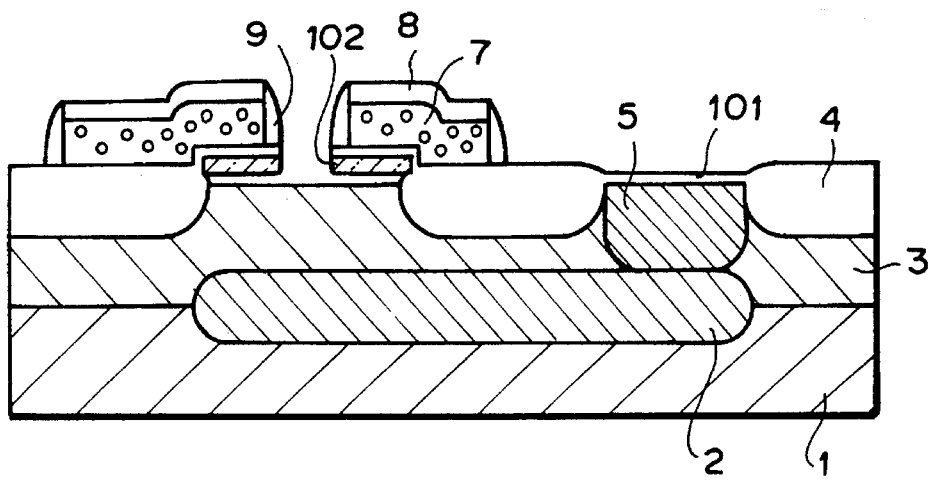

Next, as shown in FIG. 6B, ions are implanted with a resist (not shown) used as a mask, to form an n$^+$-type collector lead area 5. Thereafter, the resist is removed. Then, after the thermal oxide film 101 on the surface of the area 5 is coated with resist (not shown), the thermal oxide film 101 within the aperture is removed by isotropic wet etching. At this time, since the first sidewall 9 comprising the boron silicate glass film and the boron silicate glass film 8 are slow in etching rate as compared with the thermal oxide film 101, even if the thermal oxide film 101 having a thickness of 10 nm is overetched by 50 through 100%, the boron silicate glass film 8 and the first sidewall 9 are only etched on the order of no more than 5 nm through 10 nm. Thereafter, the resist is removed. As a result, a cavity surrounded by the n-type collector layer 3, oxide film 4 for separating elements and the nitride film 102 is formed. The depth of this cavity equals 250 nm (100 nm through 400 nm) as measured from the aperture, and its height 5 nm through 30 nm.

Figure 6C:
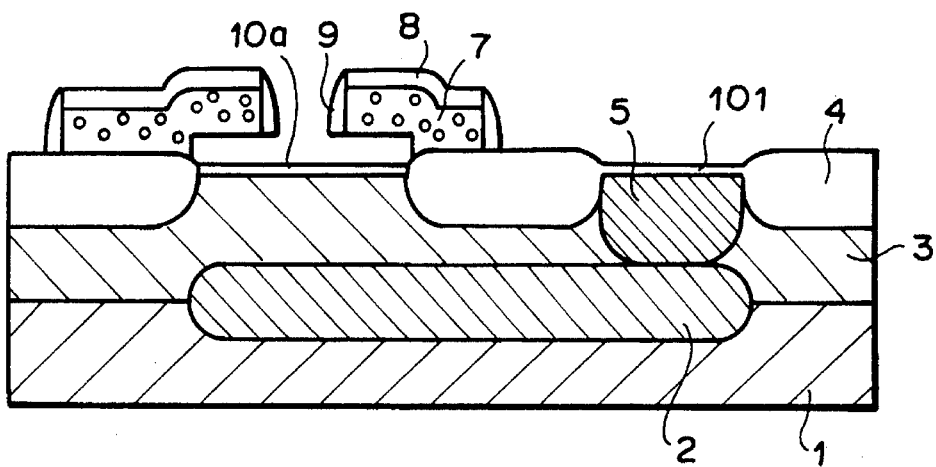

Next, as shown in FIG. 6C, silicon germanium having an impurity density of below that of the n-type collector layer 3 is selectively epitaxially grown on the exposed surface portion of the n-type collector layer 3 to a thickness of 5 nm through 30 nm to form a non-doped base layer 10a. Then, isotropic wet etching is conducted to remove the nitride film 102 within the aperture and, subsequently, isotropic wet etching is also conducted to remove the oxide film 103 within the aperture. As a result, a cavity surrounded by the non-doped base layer 10a, the oxide film 4 and the p$^+$-type base polysilicon electrode 7 is defined. The depth of this cavity equals 100 nm through 400 nm as measured from the aperture, and its height 55 nm through 220 nm.

Figure 6D:
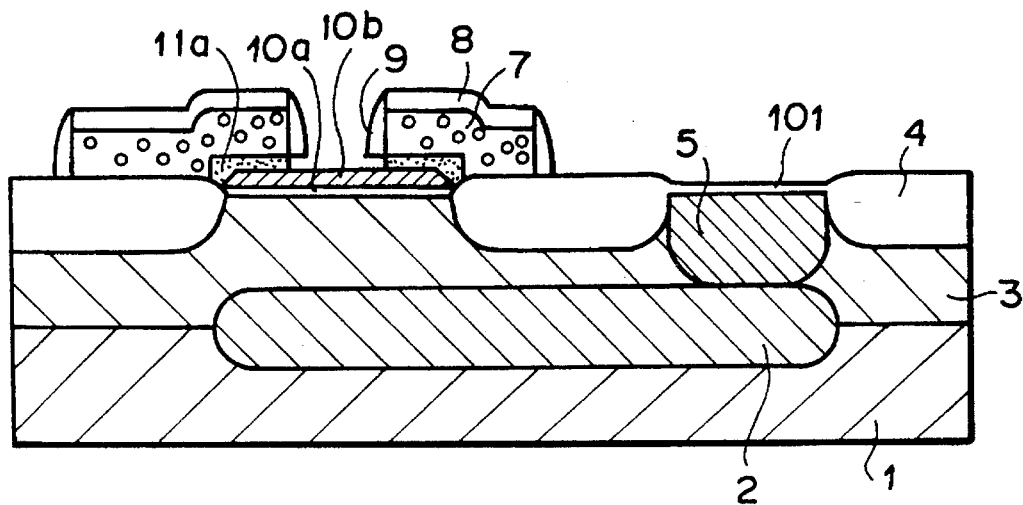

Next, as shown in FIG. 6D, on the exposed surface portion of the non-doped base layer 10a, silicon germanium having an impurity density of 1E18 through 3E19 cm$^{-3}$ is selectively epitaxially grown to the thickness of 30 nm through 125 nm and then silicon having an impurity density of 1E18 through 3E19 cm$^{-3}$ is selectively epitaxially grown to the thickness of 10 nm through 40 nm, to form a p-type silicon germanium base layer 10b. At this time, the p-type silicon germanium base layer 10b and the p$^+$-type base polysilicon electrode 7 are simultaneously interconnected by a p-type polysilicon film 11a containing germanium which grows from the p$^+$-type base polysilicon electrode 7.

Figure 6E:
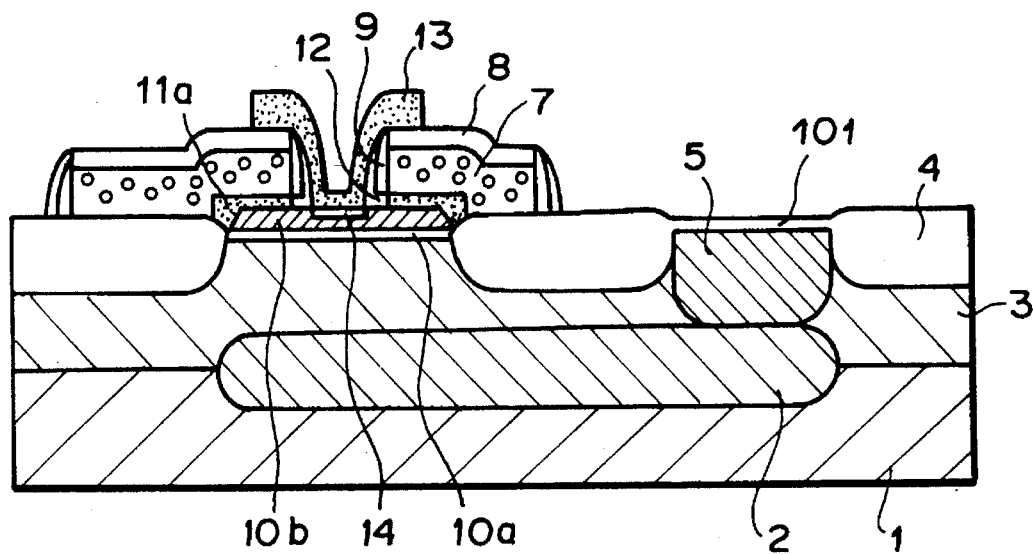

Next, as shown in FIG. 6E, an oxide film having a thickness of 80 nm (50 nm through 200 nm) is grown and then a second sidewall 12 is formed by anisotropic dry etching. Subsequently, an n$^+$-type emitter polysilicon electrode 13 is formed and, then, a heat treatment is conducted to form an n$^+$-type emitter layer 14.

FIG. 7 illustrates an impurity density profile and a germanium content profile of the transistor according to the second embodiment. As shown therein, the germanium content of the non-doped base layer 10a equals 10% and, with the p-type silicon germanium base layer, it equals 10% at the side of the substrate, and decreases gradually toward the surface reducing to zero on the way. A feature of this embodiment is that the non-doped base layer 10a can be formed below the p-type silicon germanium base layer 10b without increasing the base resistance. In the first embodiment, if the p-type base layer 10 is grown after the non-doped base layer 10a is grown, then the non-doped polysilicon (or polysilicon containing germanium), which grows simultaneously while the non-doped base layer 10a is growing, is formed between the p$^+$-type base polysilicon electrode 7 and the p-type polysilicon film 11, which in turn causes the resistance between the p$^+$-type base polysilicon electrode 7 and the p-type base layer 10 to be increased. With the second embodiment, since, while the non-doped base layer is being formed, the non-doped polysilicon cannot grow on the lower surface of the p$^+$-type polysilicon electrode 7, it cannot affect the base resistance.

Figure 9:
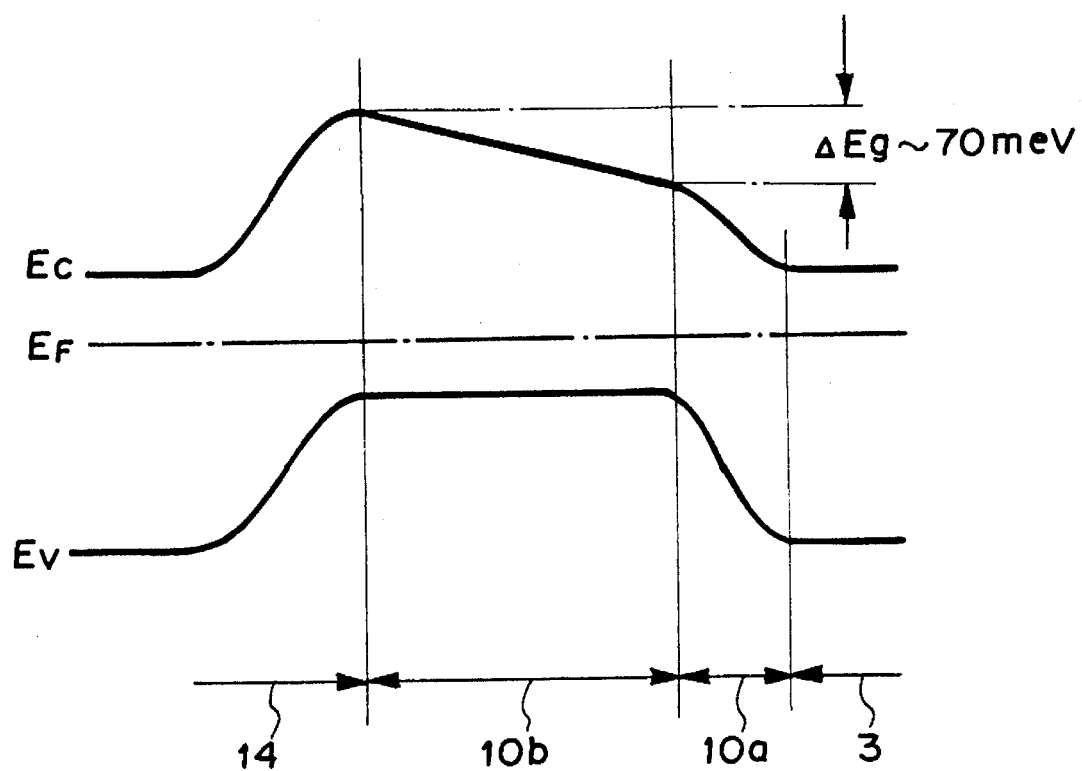
FIG. 9 is a diagram of an energy band structure in a bipolar transistor according to the second embodiment of the present invention.

FIG. 9 is a diagram of an energy band structure in a bipolar transistor of the second embodiment of the present invention. As shown in FIG. 9, an energy band gap of the additional base layer 10a is made narrower than that of the collector layer 3. An energy band gap of the base layer 10b aligns with that of the additional base layer 10a at a portion where it contacts the additional base layer and is gradually widened as it becomes spaced apart from the additional base layer.

Next, how the non-doped base layer 10a is effective is described. With a heterojunction bipolar transistor having a collector comprising a silicon layer, a base comprising a silicon germanium layer and an emitter comprising a silicon layer, it can cause a problem that the pn-junction of collectorbase junction and the heterojunction deviate due to the diffusion of the impurity from the p-type base layer, which is caused by the heat treatment conducted as the emitter is formed. Therefore, as shown in FIG. 7, the non-doped base layer 10a comprising a silicon germanium is interleaved between the n-type collector layer 3 and the p-type silicon germanium base layer 10b to align the positions of the pn-junction and the heretojunction.

Next, a third embodiment of the present invention is hereinafter described according to the orders that follow with reference to FIGS. 8A through 8I.

Figure 8A:
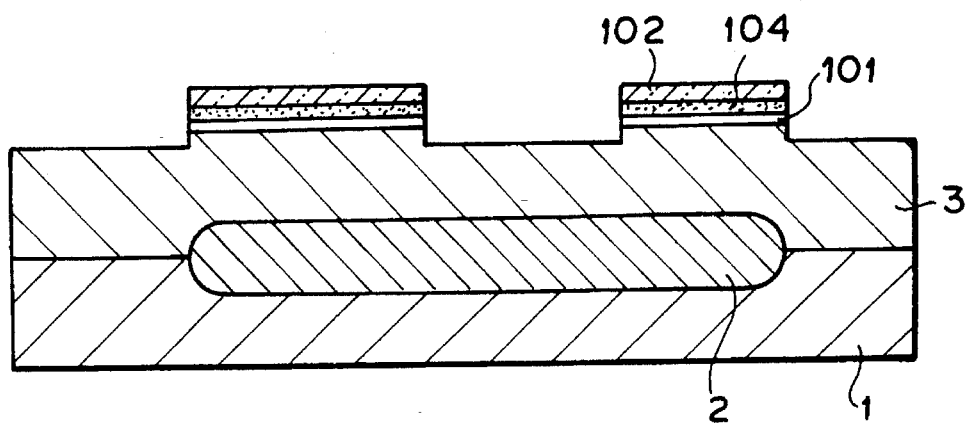
FIGS. 8A through 8I are respectively a cross-sectional view illustrating a process for manufacturing a bipolar transistor according to a third embodiment of the present invention.

First, as shown in FIG. 8A, after an n$^+$-type embedded layer 2 is formed on a p-type silicon substrate 1, an n-type collector layer 3 comprising an n-type silicon epitaxial layer is formed. Then, a thermal oxide film 101 having a thickness of 10 nm (5 nm through 30 nm) is formed, and a polysilicon film 104 having a thickness of 40 nm (30 nm through 100 nm) is grown thereon and further, a nitride film 102 having a thickness of 80 nm (50 nm through 200 nm) is grown. Next, the nitride film 102, the polysilicon film 104 and the thermal oxide film 101 are partially removed by dry etching with a resist (not shown) used as a mask and, further, the exposed surface of the n-type collector layer 3 is removed by 150 nm (100 nm through 300 nm) by dry etching before the resist is removed.

Figure 8B:
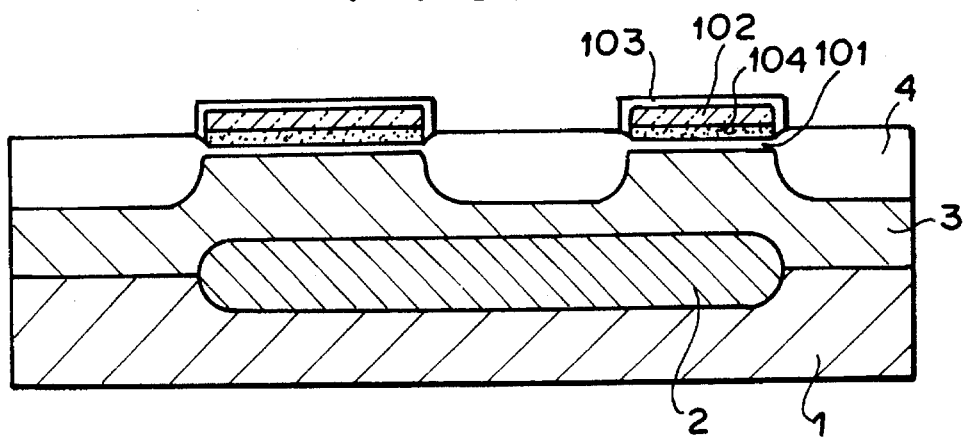

Next, as shown in FIG. 8B, thermal oxidation is conducted to form an oxide film 4 for separating elements having a thickness of 300 nm (200 nm through 600 nm) and, thereafter, an oxide film 103 having a thickness of 10 nm (5 nm through 20 nm) is grown.

Figure 8C:
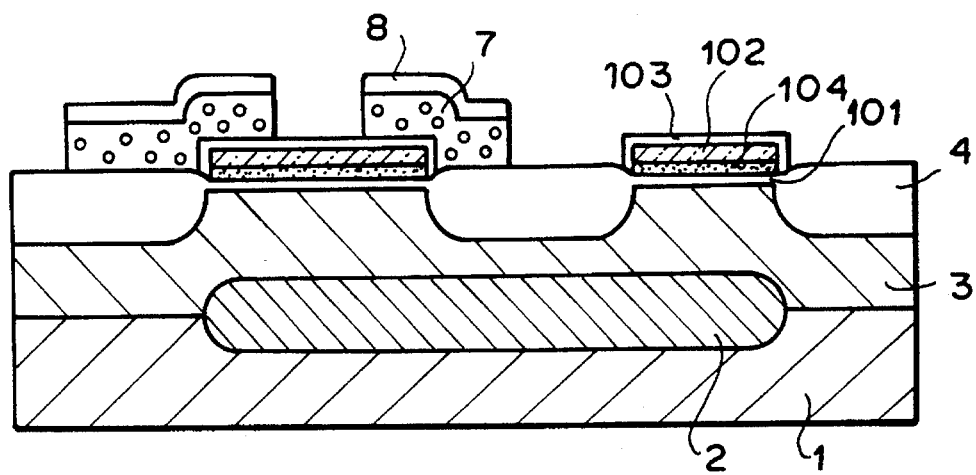

Next, as shown in FIG. 8C, a p$^+$-type polysilicon film having a thickness of 200 nm (100 nm through 300 nm) and a boron silicate glass film 8 (boron density: 3 through 10 mol %) having a thickness of 180 nm (180 nm through 400 nm) are grown and, subsequently, is dry etched with a resist (not shown) used as a mask, to pattern the boron silicate glass film 8 and the p$^+$-type polysilicon film to form a p$^+$-type base polysilicon electrode 7 before the resist is removed. At this time, an aperture is formed at the center of the boron silicate glass film 8 and p$^+$-type base polysilicon electrode 7.

Figure 8D:
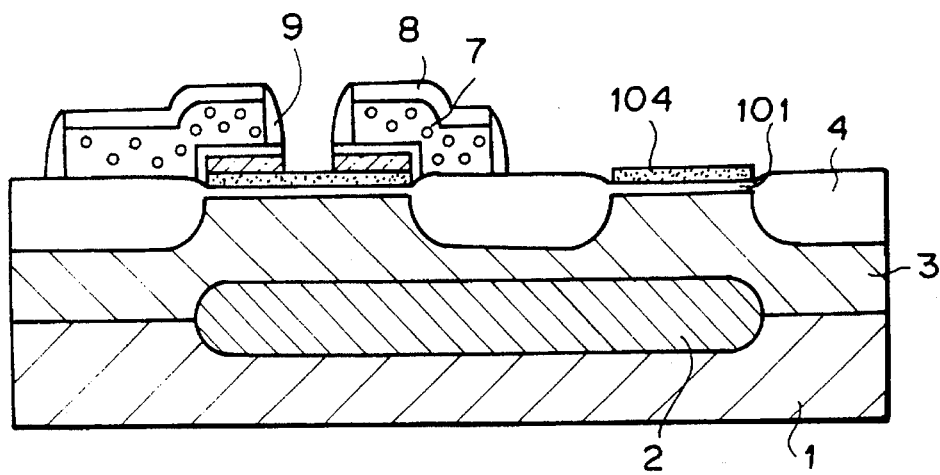

Next, as shown in FIG. 8D, after the boron silicate glass film (boron density: 3 through 10 mol %) having a thickness of 100 nm (100 nm through 200 nm) is grown, anisotropic dry etching is conducted to form a first sidewall 9 over the aperture lateral surface and outer peripheral surface of the boron silicate glass film 8 and the p$^+$-type base polysilicon electrode 7. At this time, the oxide film 103 and the nitride film 102 at the aperture portion are simultaneously etched. Also, the oxide film 103 and the nitride film 102 at the portion for forming a collector lead area are removed at this time.

Figure 8E:
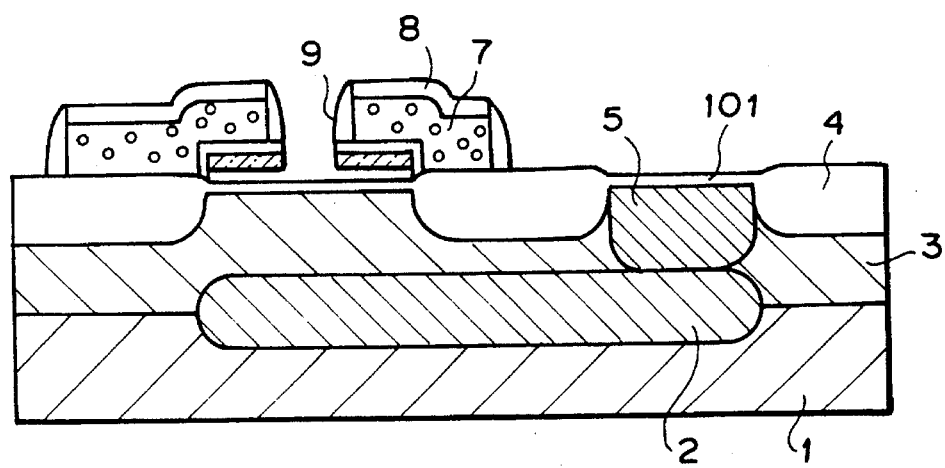

Next, as shown in FIG. 8E, the polysilicon film 104 is removed by isotropic wet etching. Subsequently, ions are implanted with a resist (not shown) used as a mask, to form an n$^+$-type collector lead area 5. Then, the resist is removed.

Figure 8F:
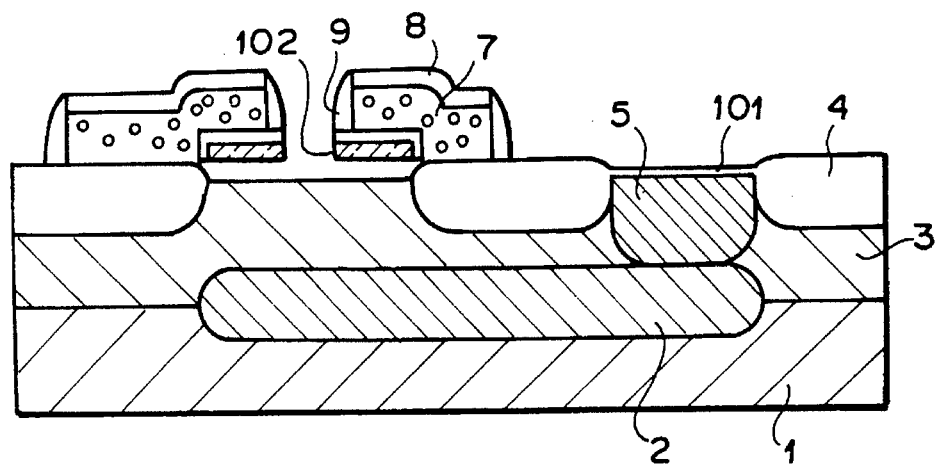

Next, as shown in FIG. 8F, after the thermal oxide film 101 lying on the surface of the n$^+$-type collector lead area 5 is coated with a resist (not shown), the thermal oxide film 101 exposed is removed by isotropic wet etching. As a result, a cavity surrounded by the n-type collector layer 3, oxide film 4 for separating elements and the nitride film 102 is formed. The depth of this cavity equals 250 nm (100 nm through 400 nm) from the aperture, and its height equals 50 nm (35 nm through 130 nm).

Figure 8G:
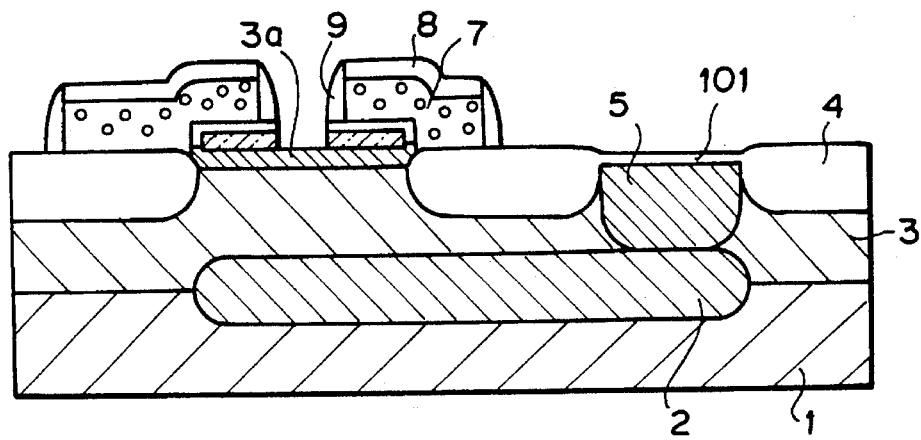

Next, as shown in FIG. 8G, an additional n-type collector layer 3a comprising an n-type silicon epitaxial layer having an impurity density of 5E15 through 5E17 cm$^{-3}$ and a thickness of 50 nm (35 nm through 130 nm) is selectively formed on the exposed surface portion of the n-type collector layer 3 by utilizing the selective epitaxial growth method.

Figure 8H:
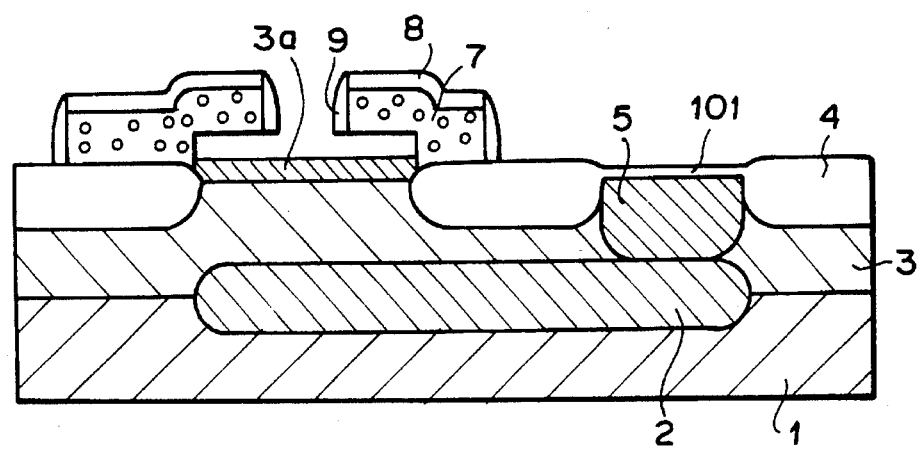

Next, as shown in FIG. 8H, the nitride film 102 within the aperture is removed by iso tropic wet etching and, subsequently, the oxide film 103 within the aperture is removed by isotropic wet etching. As a result, a cavity surrounded by the additional n-type collector layer 3a and p$^+$-type base polysilicon electrode 7 is formed. The depth of this cavity equals 250 nm (100 nm through 400 nm) as measured from the aperture, and its height equals 90 nm (55 nm through 220 nm).

Figure 8I:
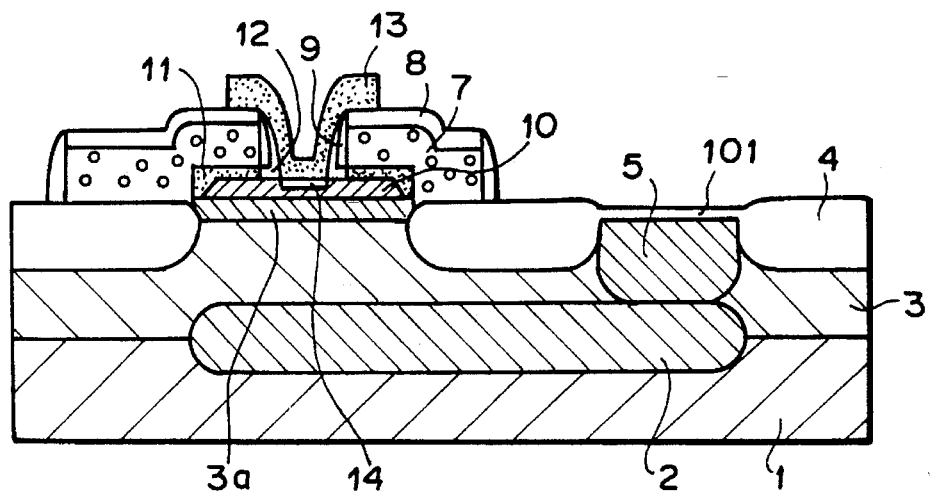

Next, as shown in FIG. 8I, a p-type base layer 10 comprising a p-type silicon epitaxial layer having an impurity density of 1E18 through 3E19 cm$^{-3}$ and a thickness of 45 nm (28 nm through 110 nm) is selectively formed on the exposed surface portion of the additional n-type collector layer 3a by utilizing the selective epitaxial growth process. At this time, the p-type base layer 10 and the p$^+$-type base polysilicon electrode 7 are interconnected by a p-type polysilicon film 11 growing from the p$^+$-type base polysilicon electrode 7 simultaneously.

Then, an oxide film having a thickness of 80 nm (90 nm through 200 nm) is grown to form a second sidewall 12 by anisotropic dry etching. Next, an n$^+$-type emitter polysilicon electrode 13 is formed and, then, a heat treatment is conducted to form an n$^+$-type emitter layer 14.

According to this embodiment, since the polysilicon film 104 is positioned below the nitride film 102, bird's beaks can be made smaller, which can be caused while the oxide film for separating elements is formed. As a result, the area of the oxide film for separating elements can be reduced, and when this embodiment is applied to a BiCMOS device incorporating the bipolar transistor and the MOS transistor on the same substrate, the width of the diffusion layer of the MOS transistor can be made smaller.

What is claimed is:

1. A bipolar transistor comprising:
   a collector layer of a first conductivity type surrounded by an oxide film for separating elements;
   a first base layer comprising a non-doped epitaxial layer formed on said collector layer;
   a second base layer comprising an epitaxial layer of a second conductivity type formed on said first base layer;
   a polysilicon film of the second conductivity type formed at a first area of a surface of said second base layer;
   an emitter layer of the first conductivity type formed at a second area of a surface of said second base layer, said polysilicon film having an upper surface and a lateral surface;
   a base polysilicon electrode of the second conductivity type formed on the upper surface and lateral surface of said polysilicon film and on said oxide film for separating elements;
   a sidewall comprising an insulating film formed over a lateral wall of said base polysilicon electrode and a lateral wall of said polysilicon film; and
   an emitter polysilicon electrode of the first conductivity type formed over said emitter layer and said side wall, wherein
   an energy band gap of said first base layer is made narrower than that of said collector layer, an energy band gap of said second base layer being aligned with that of said first base layer at a portion where it contacts said first base layer and being gradually widened towards the emitter layer away from said first base layer.

2. Bipolar transistor as set forth in claim 1, wherein said second base layer is separated from said base polysilicon electrode by said polysilicon film.

3. Bipolar transistor as set forth in claim 1, wherein said first area includes an outer peripheral portion of an upper surface of said second base layer.

4. Bipolar transistor as set forth in claim 1, wherein said first area includes an outer peripheral portion of an upper surface and a lateral surface of said second base layer.

5. Bipolar transistor as set forth in claim 1, wherein a surface of said base polysilicon electrode is coated with a boron silicate glass film, and at least part of said sidewall is made of boron silicate glass.

* * * * *